United States Patent
Schlarmann et al.

(10) Patent No.: US 9,118,334 B2
(45) Date of Patent: Aug. 25, 2015

(54) SYSTEM AND METHOD FOR IMPROVED MEMS OSCILLATOR STARTUP

(71) Applicants: Mark E. Schlarmann, Chandler, AZ (US); Deyou Fang, Chandler, AZ (US); Keith L. Kraver, Gilbert, AZ (US)

(72) Inventors: Mark E. Schlarmann, Chandler, AZ (US); Deyou Fang, Chandler, AZ (US); Keith L. Kraver, Gilbert, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 111 days.

(21) Appl. No.: 13/839,079

(22) Filed: Mar. 15, 2013

(65) Prior Publication Data

US 2014/0266474 A1  Sep. 18, 2014

(51) Int. Cl.
*H03B 5/30* (2006.01)
*H03L 3/00* (2006.01)

(52) U.S. Cl.
CPC .. *H03L 3/00* (2013.01); *H03B 5/30* (2013.01); *H03B 2200/0094* (2013.01)

(58) Field of Classification Search
CPC ............ B81C 1/00246; B81C 2203/0714; B81C 2203/0742; B81C 1/0023; B81C 2203/0118; B81C 2203/0136; H03B 2200/0012; H03B 2200/0026; H03B 2200/0046; H03B 5/02; H03B 5/1206; H03B 5/1228; H03B 2200/0082; H03B 5/04; H03B 5/30; H03K 3/0315; H03K 5/14; H03K 5/15046; H03K 5/1508
USPC .............. 331/96, 154, 116 M; 310/317
See application file for complete search history.

(56) References Cited

U.S. PATENT DOCUMENTS

| | | | |
|---|---|---|---|
| 6,769,304 B2 | 8/2004 | Platt et al. | |
| 6,792,802 B2 | 9/2004 | Platt | |
| 6,981,415 B2 | 1/2006 | Platt et al. | |
| 8,474,317 B2 * | 7/2013 | Rizzo Piazza Roncoroni et al. ........................ | 73/504.12 |
| 2007/0069829 A1 * | 3/2007 | Gehring ....................... | 331/158 |

* cited by examiner

*Primary Examiner* — Arnold Kinkead
(74) *Attorney, Agent, or Firm* — Schmeiser, Olsen & Watts LLP

(57) ABSTRACT

A MEMS resonator system comprises a MEMS resonator, kick start circuitry, feedback circuitry, an oscillator, and a switch. The MEMS resonator system is configured to provide a pulsed kick-start signal having a frequency and period such that energy delivered to the MEMS resonator is optimized in a short period of time, resulting is reduced oscillator startup time. The MEMS resonator system is configured to switch out the kick-start signal when the MEMS resonator oscillation has been achieved, and switch in feedback circuitry to maintain the MEMS resonator in a state of oscillation.

8 Claims, 5 Drawing Sheets

SYSTEM AND METHOD FOR IMPROVED MEMS OSCILLATOR STARTUP

TECHNICAL FIELD OF THE INVENTION

The present invention relates generally to microelectromechanical systems (MEMS) devices utilized in electronic systems. More specifically, the present invention relates to systems and methods for decreasing startup times associated with MEMS oscillators.

BACKGROUND OF THE INVENTION

Microelectromechanical Systems (MEMS) devices are widely used in applications such as automotive, inertial guidance systems, household appliances, protection systems for a variety of devices, cellular communication devices, and many other industrial, scientific, and engineering systems. Such MEMS devices may be used to sense a physical condition such as acceleration, pressure, angular rotation, or temperature, and to provide an electrical signal representative of the sensed physical condition to the applications and/or systems employing the MEMS sensors. Such MEMS devices may also include, or be used to provide, oscillator functionality to a variety of electromechanical systems.

BRIEF DESCRIPTION OF THE DRAWINGS

A more complete understanding of the present invention may be derived by referring to the detailed description and claims when considered in connection with the Figures (not necessarily drawn to scale), wherein like reference numbers refer to similar items throughout the Figures, and:

DETAILED DESCRIPTION

Figure 1:
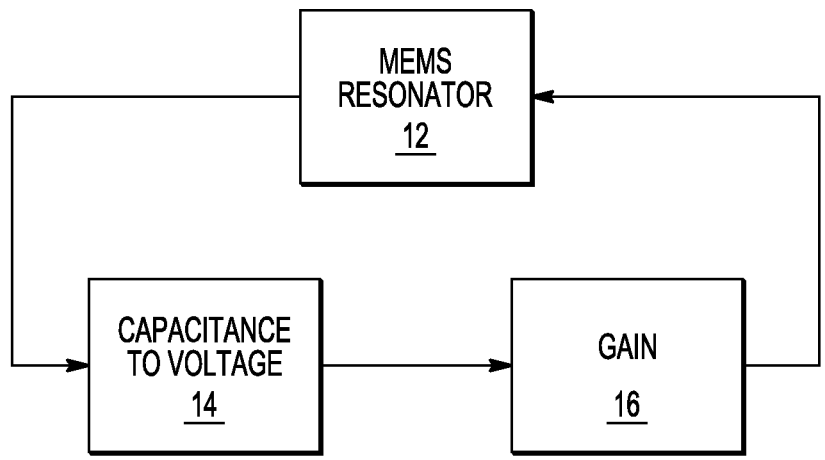
FIG. 1 shows a block diagram of a typical MEMS resonator circuit.

Capacitive-sensing MEMS designs are highly desirable for operation in acceleration, angular rotation, pressure environments and in miniaturized devices due to their relatively low cost. When subjected to acceleration, angular rotation, pressure, or some other external stimulus to which the MEMS device is designed to be responsive, capacitive sensing MEMS devices provide a change in electrical capacitance that corresponds to the magnitude of the applied stimulus. In other words, the electrical output at a given time of a MEMS device corresponds to the magnitude of the stimulus applied to that MEMS device at that given time. In this manner, by monitoring the electrical output of a MEMS device, a system may determine the magnitude of external stimuli applies to various MEMS devices (pressure, acceleration, etc.), and use that information to help determine what actions the system should take responsive to the stimuli. For example, an automotive air bag system sensing a rapid deceleration of the automobile based on the electrical output of a MEMS accelerometer device may determine that it is necessary to deploy an airbag in order to protect a vehicle occupant. One common form of MEMS device is an accelerometer in the form of a two layer capacitive transducer having a "teeter-totter" or "see saw" configuration. This commonly utilized transducer type uses a movable element or plate that rotates under z-axis acceleration above a substrate. The accelerometer structure can measure two distinct capacitances to determine differential or relative capacitance, and provide that information as an output to the MEMS accelerometer. Other MEMS devices designed to sense other applied stimuli may take on various forms, provided that the output of the MEMS device is configured to correspond to the magnitude of the stimulus being monitored.

In certain applications, including in certain applications in which the MEMS device is also serving as a sensor, the MEMS devices may also be configured to provide oscillator functionality. In some applications, the MEMS device may be configured to function only as an oscillator. When functioning as an oscillator, a function of the MEMS device may be to provide an output signal having a specified frequency and a pre-determined output signal magnitude. This oscillating output signal provided by the MEMS circuit may serve as an input to other system devices and components that require a specified input frequency signal to function, and may also serve as a reference signal or reference point to determine if a MEMS sensor is being subjected to certain forces.

In one example involving a MEMS inertial sensor application, the oscillating signal, or the oscillation of a mechanical portion of the MEMS device, may be used by the MEMS sensor to determine if motion is occurring relative to a certain axis. This information may then be used by a device employing the MEMS inertial sensor to determine a direction and/or distance of travel of a device containing or utilizing the MEMS inertial sensor. In such an application, the oscillation provided by the MEMS device is necessary in order for the system to determine if motion is taking place, and the characteristics of such motion.

All oscillators, including MEMS oscillators, require the provision of external energy into the oscillator system to keep the oscillator properly operating at the desired frequency and with the desired amplitude. In addition, all oscillators, when in a non-oscillating state, require the provision of energy to the oscillator to enter the oscillating state. Furthermore, in all oscillators, there is a delay between the time that energy is applied to the oscillator, and the time that the oscillator begins properly oscillating at the desired frequency and at the desired magnitude.

In many electronics system, such as, for example, handheld phone and computer systems and other battery powered systems such as automobiles, low power consumption is an important design criterion. The goal is to provide user functionality on demand, but without unnecessarily draining the system battery. Many of these systems employ MEMS sensors and/or oscillators to provide functionality, such as, for example, navigation functionality. Many navigation systems employ MEMS oscillators to provide a reference point for the system such that it can determine details about the movement of the navigation system. Without the MEMS oscillator reference point, the ability of the navigation system to provide accurate information regarding the travel of the navigation system is compromised. Therefore, it is important that when a navigation system is to be used, the MEMS oscillator be properly operating. However, as noted above, all oscillators require the provision of energy to keep the oscillator oscillating. Because of this need for energy, keeping MEMS oscillators continuously running is problematic because of the drain on battery power.

On the other hand, turning the MEMS oscillators on only "as needed," although serving to reduce power consumption, is also problematic. Users of such systems typically want to be able to use the devices (such as, for example, cell phones having navigation capability or automobile navigation systems) immediately, on demand. However, as noted above, there is a delay between the time that energy is applied to a MEMS resonator that is not in a resonating state, and the time when the MEMS oscillator is resonating at the appropriate frequency and magnitude to allow devices relying on it to properly function. The delay in startup time can be so long as to make "on demand" oscillation unacceptable for many applications.

One example in which "on demand" oscillation might be used is in the area of cell-phone based navigation or tracking. The cell phone might contain an accelerometer circuit that senses motion of the phone, and might also contain navigation circuitry employing a MEMS sensor that tracks the motion of the phone (direction and distance of travel). When the accelerometer senses acceleration in the phone indicative of motion, it might cause circuitry in the cell phone to "turn on" the MEMS oscillator so that the inertial navigation system can begin tracking the motion of the phone. However, the inertial navigation system will not be able to function until the MEMS oscillator is oscillating at the required frequency and magnitude. While the inertial navigation system is "waiting" for the MEMS oscillator to start up, valuable data relating to the motion of the phone during the startup period is lost.

What is needed is a system and method for decreasing the startup time in MEMS oscillators (the amount of time required for MEMS oscillators to reach the required frequency and magnitude of oscillation). Doing so will allow systems employing MEMS oscillators to turn off MEMS oscillators when not needed, reducing power consumption, and quickly turn on MEMS oscillators in an "on demand" manner such that applications employing the MEMS oscillators aren't unnecessarily delayed by the MEMS oscillator startup process.

FIG. 1 shows a block diagram of a typical MEMS resonator circuit 10. MEMS resonator circuit 10 includes a MEMS resonator 12. MEMS resonator 12 is configured to have a fundamental or natural resonance frequency that is pre-determined based on electromechanical characteristics of the MEMS resonator 12. MEMS resonator 12 is configured to resonate or oscillate when a stimulus containing energy at the fundamental or natural frequency is applied to MEMS resonator 12. If MEMS resonator 12 is in a non-resonating state, MEMS resonator 12 will not begin oscillating absent the application of some stimulus. If MEMS resonator 12 is already in a resonating or oscillating state, MEMS resonator 12 will not continue to oscillate unless additional stimulus energy is applied to MEMS resonator 12.

Continuing with FIG. 1, MEMS resonator circuit 10 further includes capacitance-to-voltage circuitry 14 electrically coupled to MEMS resonator 12. Capacitance-to-voltage circuitry 14 is configured to receive an output capacitance signal from MEMS resonator 12 that corresponds to the motion (oscillation) of MEMS resonator 12, and to convert that output capacitance signal to a voltage signal that corresponds to the oscillation of MEMS resonator 12. The frequency of the signal provided as an input to capacitance-to-voltage circuitry 14 and provided as an output voltage by capacitance-to-voltage circuitry 14 will be similar to the natural or resonant frequency of the MEMS resonator 12.

FIG. 1 also shows MEMS resonator circuit 10 including gain circuitry 16 electrically coupled to the output of capacitance-to-voltage circuitry 14 and to MEMS resonator 12. Gain circuitry 16 is configured to monitor the magnitude of the voltage signal corresponding to the oscillation of MEMS resonator 12, and to amplify that voltage signal to maintain it at a minimum reference level. Gain circuitry 16 is further configured to provide the amplified voltage signal corresponding to the oscillation of MEMS resonator 12 as an input to MEMS resonator 12, thereby providing energy near the natural frequency of MEMS resonator 12 to MEMS resonator 12, and keeping MEMS resonator 12 oscillating at a required magnitude near the natural frequency of MEMS resonator 12. By providing this positive feedback system using capacitance-to-voltage circuitry 14 and gain circuitry 16, as long as an amplified voltage signal is provided by gain circuitry 16 to MEMS resonator 12, MEMS resonator 12 will continue indefinitely to resonate at its resonant or natural frequency.

If MEMS resonator 12 is not already oscillating, a voltage signal applied to MEMS resonator 12 by gain circuitry 16 may eventually cause MEMS resonator 12 to begin oscillation, provided that the voltage signal applied to MEMS resonator 12 contains energy at or near the resonant or natural frequency of MEMS resonator 12. Once MEMS resonator 12 begins to oscillate, the positive feedback loop including capacitance-to-voltage circuitry 14 and gain circuitry 16 will cause MEMS resonator 12 to continue to oscillate as discussed above.

Figure 2:
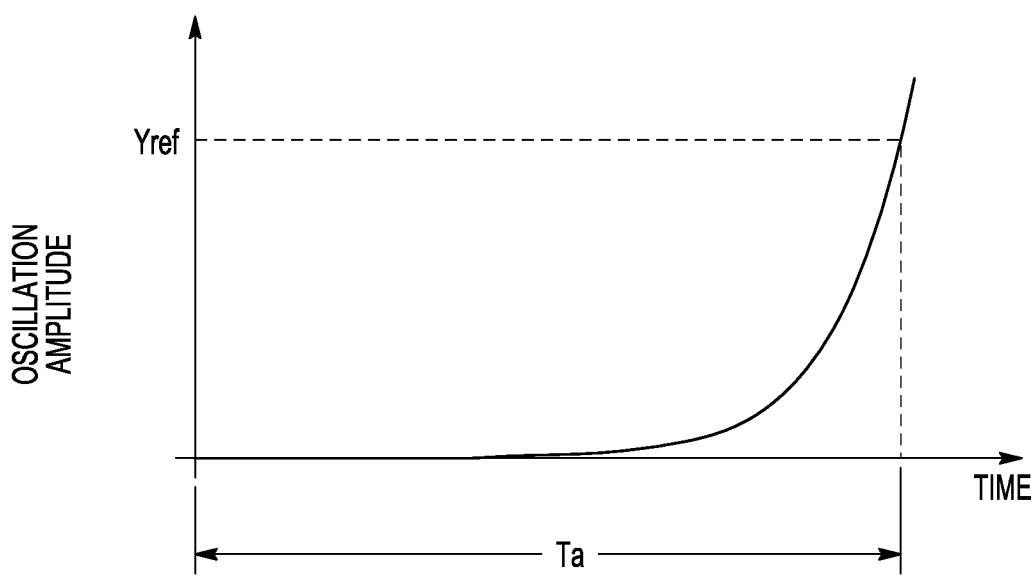
FIG. 2 shows a chart indicating a startup time associated with the typical MEMS resonator circuit of FIG. 1.

FIG. 2 shows a chart indicating a startup time associated with the typical MEMS resonator circuit 10 of FIG. 1. As noted above, if MEMS resonator 12 is not already oscillating, a voltage applied by gain circuitry 16 to MEMS resonator 12 may eventually cause MEMS resonator 12 to begin oscillation provided the voltage contains at least some energy at the natural frequency of MEMS resonator 12. However, as also noted above, time is required between the initial application of a voltage from gain circuitry 16 to MEMS resonator 12 and the time at which MEMS resonator 12 begins oscillating at a required amplitude or magnitude. The amount of time required from the initial application of a voltage by gain circuitry 16 to MEMS resonator 12 and MEMS resonator 12 reaching a required minimum amplitude Yref at which MEMS resonator 12 can be deemed to be properly functioning is generally illustrated as the time Ta in FIG. 2. In addition to electrical energy provided by gain circuitry 16, MEMS resonator 12 may be caused to begin oscillating by exposing it to other electrical or mechanical stimulus, including noise, provided that noise includes energy at the natural frequency of the MEMS resonator 12.

Figure 3:
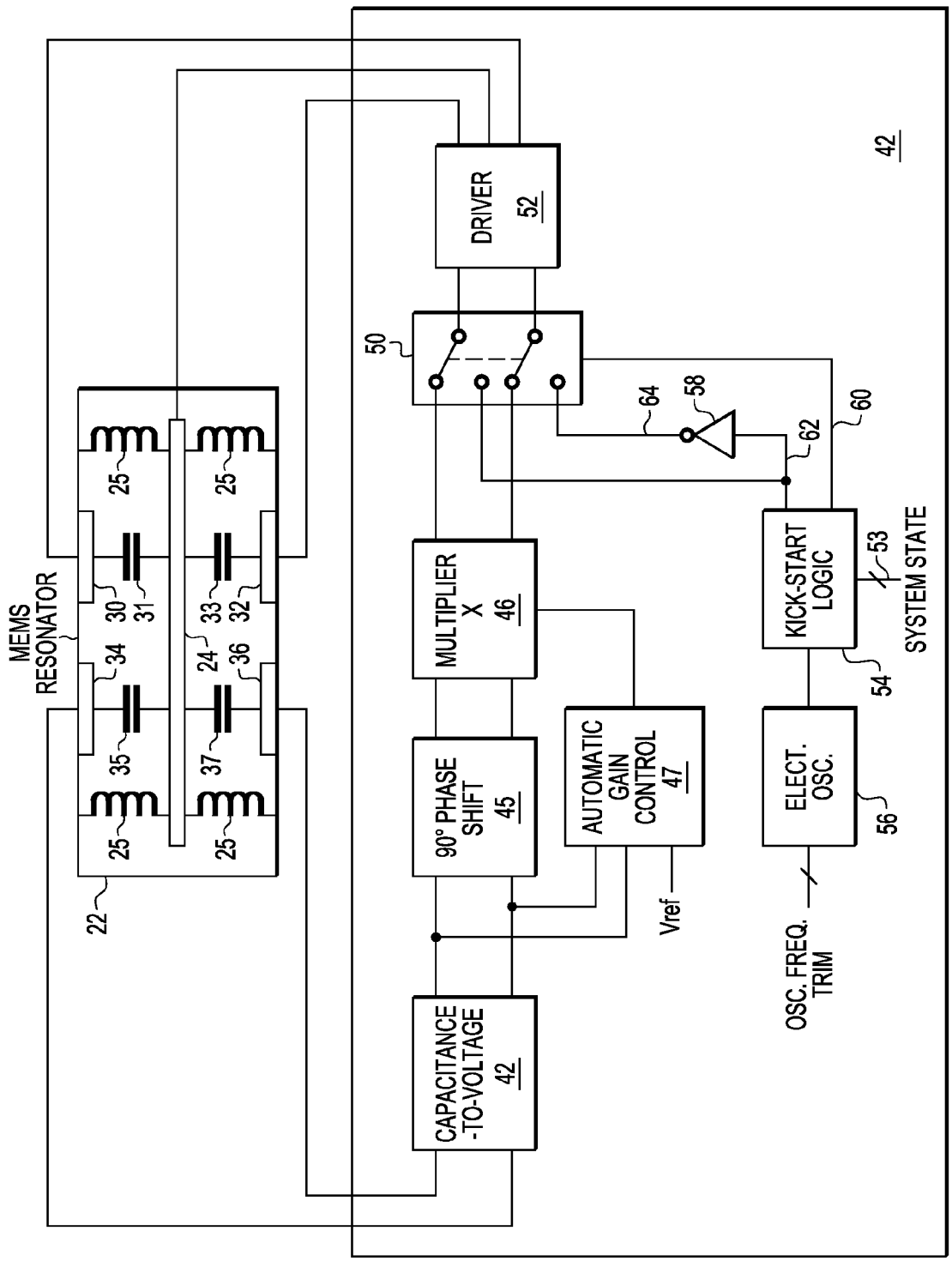
FIG. 3 shows a block diagram of a MEMS resonator system configured in accordance with the teaching of an embodiment.

FIG. 3 shows a block diagram of a MEMS resonator system 20 configured in accordance with the teaching of an embodiment. MEMS resonator system 20 includes a MEMS resonator 22. MEMS resonator 22 includes a resonating element 24 (sometimes referred to as a proof mass) coupled to MEMS resonator 22 by suspension elements 25. In an embodiment, resonating element 24 is a small metal plate, and suspension elements 25 are springs coupled to resonating element 24. Resonating element 24 is configured to be movable within a pre-determined range of travel within MEMS resonator 22 responsive to electrical or mechanical stimulus applied to resonating element 24. MEMS resonator 22 may have a fundamental or natural resonance frequency that is pre-determined based on electromechanical characteristics MEMS resonator 22. In an embodiment, the natural or resonance frequency of MEMS resonator 22 may be a function of the size, shape, and mass of resonating element 24, and of the size, shape, location, and other characteristics, such as, for example, spring constants, of suspension elements 25. Resonating element 24 of MEMS resonator 22 is configured to resonate or oscillate when a stimulus containing energy at the fundamental or natural frequency of MEMS resonator 22 is applied to MEMS resonator 22. If MEMS resonator 22 is in a non-resonating state, MEMS resonator 22 will not begin oscillating absent the application of some stimulus. If MEMS resonator 22 is already in a resonating or oscillating state, MEMS resonator 22 will not continue to oscillate unless additional stimulus energy is applied to MEMS resonator 22.

Resonating element 24 is also shown being electronically coupled to driver circuitry 52 (discussed infra). MEMS resonator 22 also comprises drive actuation input 30 and drive actuation input 32, each of which are electronically coupled to driver circuitry 52. As shown, drive actuation input 30 is located above, and is spaced apart from, resonating element 24, while drive actuation input 32 is located below, and is spaced apart from resonating element 24. FIG. 3 also generally illustrates a drive capacitor 31 present between drive actuation input 30 and resonating element 24, and a drive capacitor 33 present between drive actuation input 32 and resonating element 24. Although representations for capacitors are illustrated by drive capacitor 31 and drive capacitor 33, drive capacitor 31 and drive capacitor 33 are not representing physical capacitors in the embodiment of FIG. 3. Rather, drive capacitor 31 is illustrating the fact that drive actuation input 30, resonating element 24, and the space between drive actuation input 30 and resonating element 24 have characteristics of a capacitor when an electronic signal is applied to drive actuation input 30 and resonating element 24. Drive capacitor 33 is illustrating the fact that drive actuation input 32, resonating element 24, and the space between drive actuation input 32 and resonating element 24 have characteristics of a capacitor when an electronic signal is applied to drive actuation input 32 and resonating element 24.

In operation, when a voltage is applied to drive actuation input 30 (whether positive or negative) relative to a voltage applied to resonating element 24, charge will be deposited on drive actuation input 30. The charge differential between drive actuation input 30 and resonating element 24 (which are effectively acting as drive capacitor 31) causes resonating element 24 to be attracted to drive actuation input 30, and will cause resonating element 24 to move upward toward drive actuation input 30. Once the voltage (and corresponding charge) is removed from drive actuation input 30, suspension elements 25 will tend to cause resonating element 24 to move back downward toward its initial position. When a voltage is applied to drive actuation input 32 (whether positive or negative) relative to a voltage applied to resonating element 24, a charge will be deposited on drive actuation input 32. The charge differential between drive actuation input 32 and resonating element 24 (which are effectively acting as drive capacitor 33) causes resonating element 24 to be attracted to drive actuation input 32, and will cause resonating element 24 to move downward to drive actuation input 32. Once the voltage (and corresponding charge) is removed from drive actuation input 32, suspension elements 25 will tend to cause resonating element 24 to move back upward toward its initial position. In this manner, by applying voltages to drive actuation input 30 and drive actuation input 32, resonating element 24 may be caused to move upward and downward responsive to the applied voltage. It should be appreciated that by varying the voltages applied to drive actuation input 30 and drive actuation input 32, and the timing of the application of the voltages, resonating element 24 may be caused to oscillate, and that if the timing and sequencing of the applied voltages is appropriate, resonating element 24 may be caused to oscillate at its natural or resonant frequency.

MEMS resonator 22 also comprises drive measurement output 34 and drive measurement output 36, each of which are electronically coupled to capacitance-to-voltage circuitry 42. As shown, drive measurement output 34 is located above, and is spaced apart from, resonating element 24, while drive measurement output 36 is located below, and is spaced apart from resonating element 24. FIG. 3 also generally illustrates a measurement capacitor 35 present between drive measurement output 34 and resonating element 24, and a measurement capacitor 37 present between drive measurement output 36 and resonating element 24. Although representations for capacitors are illustrated by measurement capacitor 35 and measurement capacitor 37, measurement capacitor 35 and measurement capacitor 37 are not representing physical capacitors in the embodiment of FIG. 3. Rather, measurement capacitor 35 is illustrating the fact that drive measurement output 34, resonating element 24, and the space between drive measurement output 34 and resonating element 24 have characteristics of a capacitor. Measurement capacitor 37 is illustrating the fact that drive measurement output 36, resonating element 24, and the space between drive measurement output 36 and resonating element 24 have characteristics of a capacitor.

In operation, when resonating element 24 moves relative to drive measurement output 34 and drive measurement output 36, because of the capacitor-like characteristics of drive measurement output 34, drive measurement output 36 and resonating element 24 (measurement capacitor 35 and measurement capacitor 37), there is a change in the charges present on drive measurement output 34 and drive measurement output 36. This change in charges (effectively a change in capacitance of measurement capacitor 35 and measurement capacitor 37) is provided to capacitance-to-voltage circuitry 42. It should be appreciated that as resonating element 24 moves and/or resonates, the pattern of change in capacitance values provided to capacitance-to-voltage circuitry 42 will correspond to the motion of resonating element 24, and the magnitude of the change in capacitance values will correspond to the magnitude of the motion of resonating element 24. For example, if resonating element 24 is oscillating at a certain frequency and magnitude, the pattern of changes in capacitance values will correspond to the oscillation frequency and magnitude. By monitoring the changes in capacitance values over time, it is possible to determine at what frequency resonating element 24 is oscillating, and the magnitude of the oscillation.

MEMS resonator system 20 further comprises a capacitance-to-voltage circuitry 42 electronically coupled to MEMS resonator 22, phase-shift circuitry 45, and automatic gain control circuitry 47. As noted above, capacitance-to-voltage circuitry 42 is configured to receive capacitance values from MEMS resonator 22 that correspond to the motion of resonating element 24 within MEMS resonator 22. Capacitance-to-voltage circuitry 42 is configured to convert those received capacitance values to voltage values. Capacitance-to-voltage circuitry 42 is further configured to provide the voltage values, which also correspond to the motion of resonating element 24 (both in magnitude and frequency) to circuitry external to capacitance-to-voltage circuitry 42.

MEMS resonator system 20 further comprises phase-shift circuitry 45, which is electronically coupled to capacitance-to-voltage circuitry 42 and multiplier 46. Phase-shift circuitry 45 is configured to take the voltage signal provided by capacitance-to-voltage circuitry 42, introduce a 90-degree phase shift into the signal, and provide the phase-shifted signal as an input to multiplier 46. It should be appreciated that this 90-degree phase shift is provided in order to sustain oscillation resonating element 24. MEMS resonator system 20 further comprises automatic gain control circuitry 47, which is electronically coupled to capacitance-to-voltage circuitry 42 and multiplier 46. Automatic gain control circuitry 47 is also shown receiving a reference voltage, Vref. Automatic gain control circuitry 47 is configured to receive the voltage signal provided by capacitance-to-voltage circuitry 42 and compare the amplitude of the voltage signal with the reference voltage Vref. Automatic gain control circuitry 47 is further configured to provide a signal to multiplier 46 based, in part, on the difference between the amplitude of the voltage signal and Vref that determines by how much multiplier 46 needs to amplify its output signal. Automatic gain control circuitry 47 adjusts the oscillation amplitude such that the amplitude of the voltage signal provided by capacitance-to-voltage circuitry 42 equals the reference voltage.

MEMS resonator system 20 further comprises multiplier 46 electronically coupled to phase-shift circuitry 45, automatic gain control circuitry 47 and switch 50. multiplier 46 is a variable-gain amplifier configured to receive the phase-shifted voltage signal from phase-shift circuitry 45, amplify the phase-shifted voltage signal a pre-determined amount based on the signal received from automatic gain control circuitry 47, and provide the phase-shifted, amplified signal to switch 50.

It should be appreciated that phase-shift circuitry 45, multiplier 46 and automatic gain control circuitry 47 are configured in order to sustain an oscillation condition in resonating element 24. In some embodiments, in order to sustain oscillation in a system, the phase around the "loop" (in this case, from the output of MEMS resonator 22, through capacitance-to-voltage circuitry 42, to phase-shift circuitry 45, to multiplier 46, to switch 50, to driver circuitry 52, and back to the input of MEMS resonator 22) must be an integer multiple of 360 degrees, and the total gain around the loop must be exactly 1. MEMS resonator 22 will have a ninety-degree phase shift at its natural or resonant frequency. Phase-shift circuitry 45 adds another 90-degrees to this phase shift, and the other components have negligible phase shift near the natural frequency of MEMS resonator 22. The additional 180-degree phase shift required in some embodiments to meet the 360-degree phase shift requirement is obtained by flipping the polarity of the signal somewhere in the loop. Automatic gain control circuitry 47 works actively to make sure that the total gain around the loop is exactly 1 by adjusting by how much multiplier 46 amplifies the signal, such that the amplitude of the voltage signal provided by capacitance-to-voltage circuitry 42 to automatic gain control circuitry 47 equals the reference voltage Vref.

MEMS resonator system 20 further comprises switch 50, electronically coupled to multiplier 46, kick-start logic 54, and driver circuitry 52. In the embodiment generally illustrated in FIG. 3, switch 50 is configured to switch in between two sets of inputs depending on whether switch 50 is in a first state or in a second "kick-start" state. Driver circuitry 52 includes amplification circuitry to ensure that the drive voltage of signals provided to MEMS resonator 22 is within certain limits. The signals provided to MEMS resonator 22 by driver circuitry 52 will vary depending on input source selected by switch 50. Switch 50 is configured to switch inputs to driver circuitry 52 between multiplier 46 and kick-start logic 54. In a first state, switch 50 provides the amplified, phase-shifted signal from multiplier 46 to driver circuitry 52. Driver circuitry 52 is then configured to provide the signals it receives from multiplier 46 to MEMS resonator 22 at drive actuation input 30 and drive actuation input 32. In this first state, the signals provided from multiplier 46 to MEMS resonator 22 at drive actuation input 30 and drive actuation input 32 may cause resonating element 24 of MEMS resonator 22 to eventually begin oscillating, or if resonating element 24 of MEMS resonator 22 is already in a state of oscillation, the signals provided from multiplier 46 may cause resonating element 24 of MEMS resonator 22 to continue oscillating.

MEMS resonator system 20 further comprises kick-start logic 54 electronically coupled to switch 50 and electronic oscillator 56. Kick-start logic 54 is further electronically coupled to an inverter 58, which is in turn electronically coupled to switch 50. Electronic oscillator 56 is configured to provide a pre-defined signal, also referred to as a kick pulse, oscillating at a pre-determined frequency and magnitude, to kick-start logic 54. Electronic oscillator 56 is shown having a trim input which may be adjusted to determine the frequency, period or duration of the pulse signal provided by electronic oscillator 56 to kick-start logic 54. In an embodiment, electronic oscillator 56 is configured to oscillate at a frequency near a natural resonant frequency of MEMS resonator 24. In an embodiment, near a natural resonant frequency includes the natural resonant frequency of MEMS resonator 22. In an alternative embodiment, near a natural resonant frequency includes frequencies within 250 Hz of the natural resonant frequency of MEMS resonator 22. In yet another alternative embodiment, near a natural resonant frequency includes frequencies within 500 Hz of the natural resonant frequency of MEMS resonator 22. Kick-start logic 54 is configured to receive the oscillating signal from electronic oscillator 56, provide the oscillating signal to switch 50, and to provide the oscillating signal to inverter 58, which in turn provides the complement of the oscillating signal to switch 50. Kick-start logic 54 is further configured to determine when a kick-start signal is needed by MEMS resonator system 20. Kick-start logic 54 may determine that a kick-start signal is needed based on information provided to kick-start logic 54 via the system state input 53. For example, MEMS resonator system 20 or systems in which MEMS resonator system 20 is functioning, may provide a signal to kick-start logic 54 via system state input 53 indicating that MEMS resonator 22 needs to begin oscillation to support certain functions. When kick-start logic 54 determines that a kick-start signal is necessary to start MEMS resonator 22 oscillating, kick-start logic 54 is configured to provide a signal to switch 50 causing switch 50 to switch to a second "kick start" state. In this second "kick-start" state, the oscillating pulse signal provided via kick-start logic 54, and the complement of the oscillating pulse signal provided via kick-start logic 54 and inverter 58, are provided via switch 50 to driver circuitry 52.

MEMS resonator system 20 further comprises driver circuitry 52. Driver circuitry 52 is configured to receive input signals from multiplier 46 or kick-start logic 54 via switch 50, depending on the state of switch 50. Driver circuitry 52 is configured to process signals received as inputs, adjust the voltage of those signals to be within specification, and provide the processed signals as outputs to drive actuation input 30, drive actuation input 32, and resonating element 24. The signals provided by driver circuitry 52 may, depending on the state of switch 50, cause MEMS resonator 22 to either begin oscillation or sustain oscillation at a natural frequency of MEMS resonator 22.

Referring to FIG. 3, operation of MEMS resonator system 20 in a first state in which MEMS resonator 22 is already oscillating at a natural frequency of MEMS resonator 22, is generally described, according to an embodiment of the invention. A signal including capacitance values corresponding to the frequency and magnitude of oscillation of resonating element 24 of MEMS resonator 22 is provided at drive measurement output 34 and drive measurement output 36 of MEMS resonator 22. Capacitance-to-voltage circuitry 42 converts the capacitance values to voltage values, and provides the resulting signal to phase-shift circuitry 45 and automatic gain control circuitry 47. Phase-shift circuitry 45 introduces a phase shift of 90-degrees into the signal and provides the phase-shifted signal to multiplier 46. Automatic gain control circuitry 47 compares the magnitude of the signal with a reference voltage, and provides a signal to multiplier 46 indicative of the amount by which the signal differs from the reverence voltage. Multiplier 46 amplifies the phase-shifted signal based on the signal received from automatic gain control circuitry 47, and provides the amplified, phase-shifted signal to driver circuitry 52 via switch 50. Driver circuitry 52 processes the amplified, phase-shifted signal to meet certain specification requirements, and provides the signal as inputs to MEMS resonator 22 via resonating element 24, drive actuation input 30 and drive actuation input 32. The input signals cause resonating element 24 to continue oscillating by causing resonating element 24 to move responsive to the signals. The process continues until the loop is broken by, for example, removing power from the MEMS resonator system 20, or until the switch 50 is switched to no longer permit feedback signals to be provided to MEMS resonator 22 via driver circuitry 52.

Referring to FIG. 3, operation of MEMS resonator system 20 in a second "kick-start" state in which MEMS resonator 22 may not already be oscillating at a natural frequency of MEMS resonator 22, is generally described, according to an embodiment of the invention. Electronic oscillator 56 is adjusted via its trim input to provide signal pulses (also referred to herein as "kick" pulses) that have a frequency that is near to the natural frequency of MEMS resonator 22. In an embodiment, electronic oscillator 56 is further configured to provide pulses having a duration that is the inverse of the natural frequency of MEMS resonator 22. Electronic oscillator 56 provides these kick pulses, which also have a pre-determined amplitude, to kick-start logic 54. In an embodiment, the amplitude of the pulses ranges from a minimum value of 0 Volts to a maximum value of 5V. In alternative embodiments, the maximum value may be higher or lower than 5V. Kick-start logic 54 is configured to provide a pre-determined number of pulses to driver circuitry 52 via switch 50. In an embodiment, kick-start logic 54 is configured to provide 8 kick pulses. In alternative embodiments, kick-start logic 54 may be configured to provide more or fewer kick pulses, including, for example, between 1 and 64 kick pulses. Kick-start logic 54 provides a signal 60 to switch 50 causing switch 50 to switch to a second "kick-start" state in which kick pulses are provided to driver circuitry 52 via switch 50, and the complement of kick pulses are provided to driver circuitry 52 via inverter 58 and switch 50. Kick pulses are then provided to MEMS resonator 22 at drive actuation input 30, and inverted (complemented) kick pulses are provided to MEMS resonator 22 at drive actuation input 32. These kick pulses cause resonating element 24 of MEMS resonator 22 to begin oscillating near its natural frequency. In an alternative embodiment (not shown), kick-start logic 54 may be configured to monitor the amplitude of oscillation and/or other characteristics of MEMS resonator 22, and to provide kick pulses until the amplitude reaches a pre-determined threshold or has certain pre-determined characteristics.

Figure 4A:
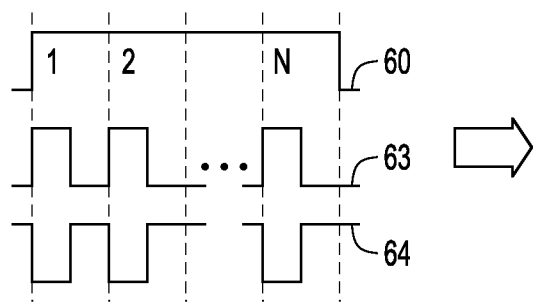
FIGS. 4a and 4b show diagrams generally illustrating certain signals and forces associated with the embodiment of FIG. 3.
Figure 4B:
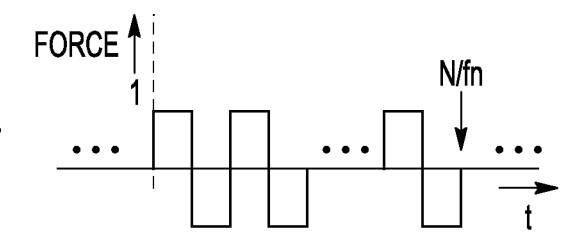

FIGS. 4a and 4b show diagrams generally illustrating certain signals and forces associated with the embodiment of FIG. 3. Referring to FIG. 4a, signal 62 generally illustrates a train of kick pulses provided to MEMS resonator 22 at drive actuation input 30, and signal 64 generally illustrates the complement of the same train of kick pulses provided to MEMS resonator 22 at drive actuation input 32. Signal 60 generally illustrates a signal provided by kick-start logic 54 to switch 50. When signal 60 is high, switch 50 is caused to switch to the second "kick-start" state in which signals 62 and 64 are provided to MEMS resonator 22 at drive actuation input 30 and drive actuation input 32, respectively. As shown, signal 60 remains high until a predetermined number N of kick pulses. FIG. 4b generally illustrates the electrostatic force applied to resonating element 24 in response to kick signals 62 and 64 when signal 60 is in a high state.

Referring to the occurrence of the first pulse (1), it can be seen that signal 62 is at a high value (for example, 5 Volts) during the first half of the first pulse, and is at a value of 0 during the second half of the pulse. At the same time, signal 64, the complement of signal 62, is at a value of 0 during the first half of the pulse, and a high value (for example, 5 Volts) during the second half of the pulse. Referring to FIG. 4b, it can be seen that in the first half of the pulse, resonating element 24 is caused to move in an upward direction as a result of the application of signal 62 and signal 64 to drive input 30 and drive actuation input 32, respectively, and that in the second half of the first pulse period resonating element 24 is caused to move in a downward direction as a result of the application of signal 62 and signal 64 to drive actuation input 30 and drive actuation input 32. More specifically, during the first half of the pulse, a positive voltage is applied to drive actuation input 30 via signal 62, 0 Volts are applied to drive actuation input 32 via signal 64, and resonating element 24 is pulled in an upward direction toward drive actuation input 30. During the second half of the pulse, a positive voltage is applied to drive actuation input 32 via signal 64, 0 Volts are applied to drive actuation input 32 via signal 62, and resonating element 24 is pulled in a downward direction toward drive actuation input 32. In an embodiment, resonating element 24 may be driven by a constant value of 0V.

Similar motion (up and down) would occur to resonating element 24 as a result of subsequent pulses (pulses 2 through N) as generally illustrated in FIG. 4b. In this manner, application of pulses 1 though N by kick-start logic 54 causes resonating element 24 of MEMS resonator 22 to begin. In addition, because the applied pulses have a frequency that is the same as or near the natural or fundamental frequency of MEMS resonator 22, resonating element 24 of MEMS resonator 22 will begin oscillating much more rapidly than if MEMS resonator 22 were simply subjected to white noise, random signals, or a DC voltage. In the embodiment generally illustrated in FIGS. 3, 4a and 4b, kick-start logic 54 is configured to deliver a predetermined number of pulses to minimize the amount of time required to start MEMS resonator 22 oscillating at its natural frequency.

It should be appreciated that although the pulses in FIG. 4a are shown as square waves, reactive components to which the pulses are applied (including resonating element 24 and drive actuation input 30 and drive actuation input 32) will actually respond to the applied pulses as though the pulses are a combination of multiple sine waves, including sine waves having a frequency near the natural frequency of MEMS resonator 22 as provided by kick-start logic 54.

Figure 4C:
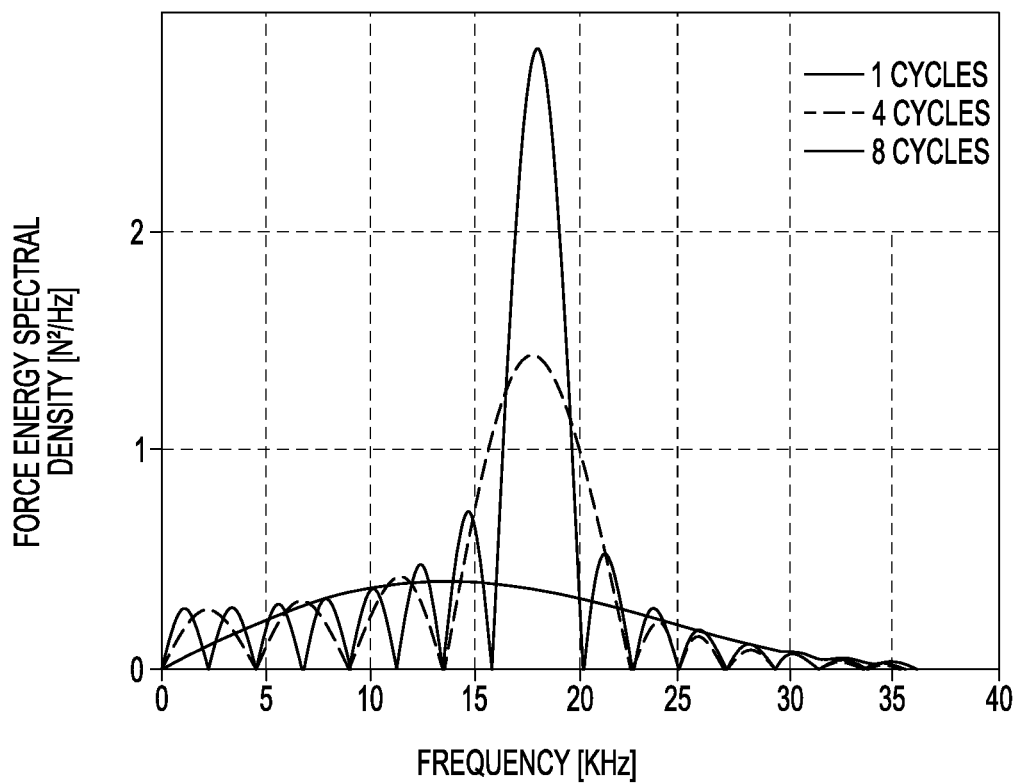
FIG. 4c shows a chart generally illustrating energy density by frequency associated with the embodiment of FIG. 3.

FIG. 4c shows a chart generally illustrating energy density by frequency associated with the embodiment of FIG. 3. More specifically, FIG. 4c shows that by providing a kick pulse having the same frequency as the natural frequency of MEMS resonator 22 (assuming, for example, that the natural frequency is approximately 18 kHz), the energy delivered to MEMS resonator 22 at the fundamental or natural frequency of MEMS resonator 22 can be increased dramatically by increasing the number of kick pulses delivered. For example, while the energy delivered by 1 kick pulse does provide some additional focused energy at 18 kHz, much energy is distributed at other frequencies as well. However, when the number of kick pulses is increased to 8, the amount of focused energy delivered at 18 kHz increases dramatically. By providing this additional, focused energy, MEMS resonator 22 can be caused to reach its desired oscillation magnitude much more quickly than if only 1 pulse is employed.

Figure 5:
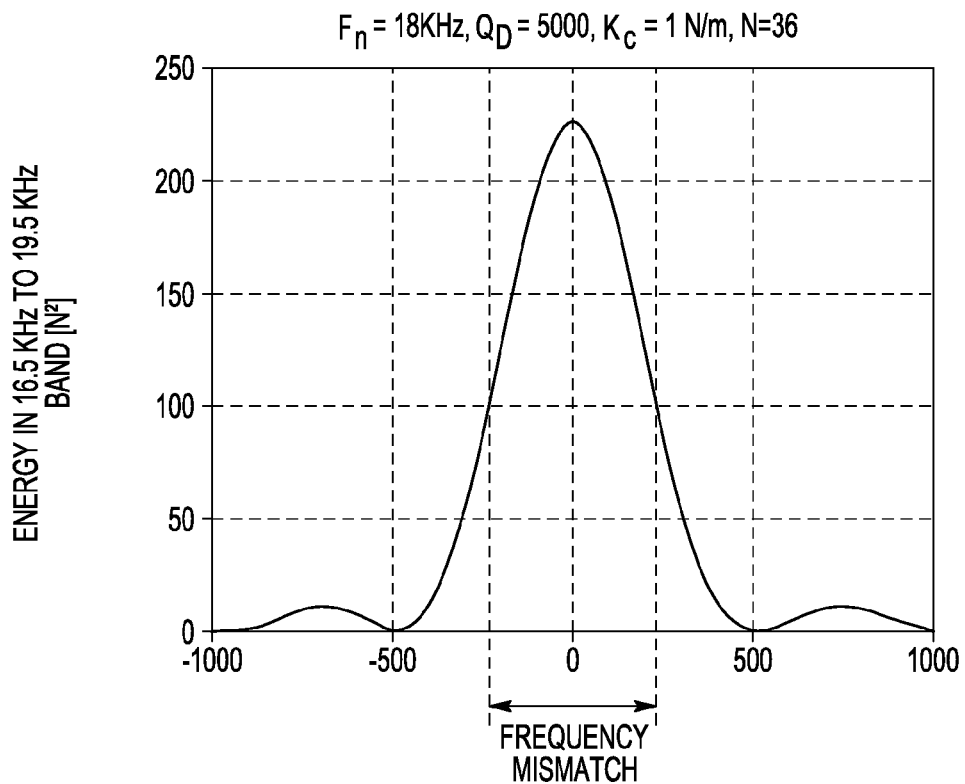
FIG. 5 shows a chart generally illustrating the approximate force energy by frequency mismatch associated with the embodiment of FIG. 3.

FIG. 5 shows a chart generally illustrating approximate force energy by frequency mismatch associated with the embodiment of FIG. 3. More specifically, FIG. 5 shows that the closer the frequency of the kick pulses provided by electronic oscillator 56 is to the natural frequency of MEMS resonator 22, the more energy that is delivered to MEMS resonator 22. When the frequencies are identical, the energy delivered by the kick pulses is maximized. In general, the greater the difference between the kick pulse frequency and the natural frequency, the lower the amount of focused energy that is delivered to MEMS resonator 22 for startup. As shown, utilizing electronic oscillator 56 to provide kick pulses having a frequency within 250 Hz of the natural frequency of MEMS resonator 22 provides significant focused energy without requiring that the frequency of electronic oscillator 56 be precisely matched to the natural frequency.

Figure 6:
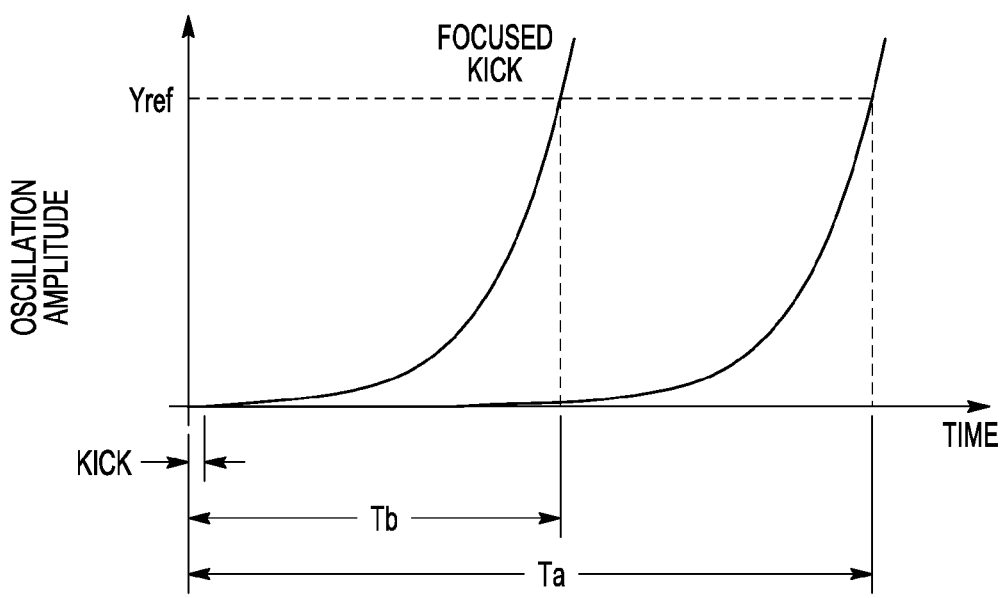
FIG. 6 shows a chart generally comparing startup times associated with a typical MEMS resonator circuit and the embodiment of FIG. 3; and, FIG. 7 shows a flow chart of a method for decreasing startup times associated with MEMS oscillators, according to an embodiment.

FIG. 6 shows a chart generally comparing startup times associated with a typical MEMS resonator circuit and the embodiment of FIG. 3. Ta generally represents a hypothetical startup time for a MEMS resonator circuit configured as shown in FIG. 1. Tb generally illustrates a startup time associated with a MEMS resonator circuit in which the MEMS resonator receives a number of kick pulses having a frequency near the natural frequency of the MEMS resonator. As can be seen in FIG. 6, the startup time (Tb) for the MEMS resonator receiving the kick pulses is significantly less than the startup time (Ta) for a typical MEMs resonator. This reduced startup time can provide significant benefits, especially in applications in which quick startup of MEMS oscillators can permit usage modes that reduce battery consumption and improve ease of use.

Figure 7:
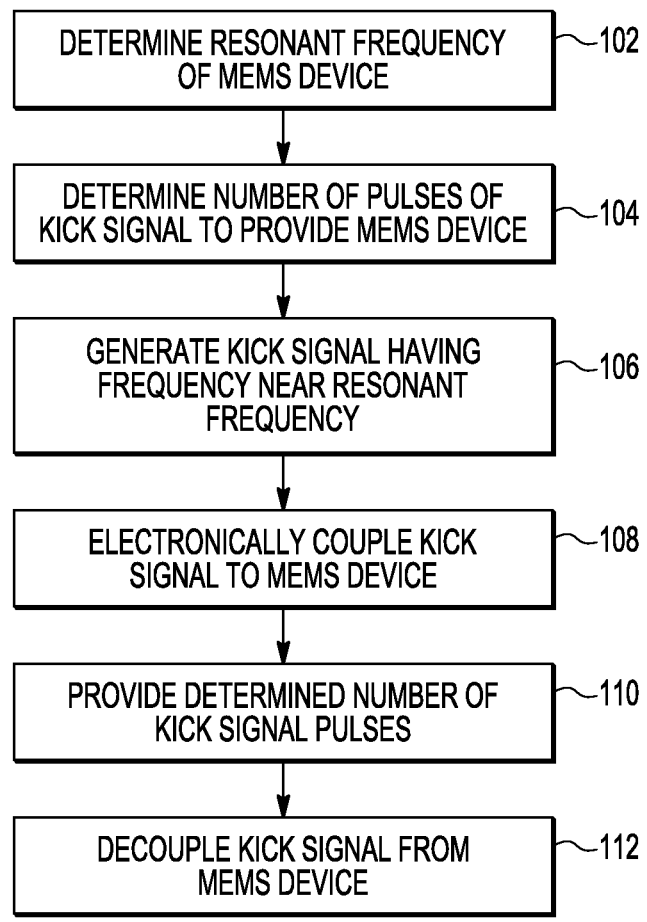

FIG. 7 shows a flow chart of a method 100 for decreasing startup times associated with MEMS oscillators, according to an embodiment. In an embodiment, the method 100 is implemented by MEMS resonator system 20 generally illustrated in FIG. 3. In a first operation 102, the natural resonant frequency of a MEMS resonator is determined. In a second operation 104, a number of kick signal pulses to be provided to the MEMS resonator is determined. In a third operation 106, a kick signal having a fundamental frequency near the natural resonant frequency is generated. In a fourth operation 108, the kick signal is electronically coupled to the MEMS resonator. In a fifth operation 110, the determined number of kick signal pulses is provided to the MEMS resonator. In a sixth operation 112, the kick signal is decoupled from the MEMS device. In an embodiment, operation 102 and 104 are performed at the factory when the MEMS resonator 22 is manufactured, and information related to the natural resonant frequency of MEMS resonator 22 and/or the number of kick pulses may be programmed into MEMS resonator system 20 during manufacturing or testing.

In an alternative embodiment (not shown), all of the components generally illustrated in FIG. 3 may be formed together on a single substrate and provided as a unitary device. In yet another alternative embodiment (not shown), all of the components generally illustrated in FIG. 3 may be coupled together in a single module. In yet another alternative embodiment, the MEMS oscillator may be a different type of MEMS oscillator than that generally illustrated in FIG. 3, such as, for example, a rotary oscillator, or other MEMS oscillator having at least one member configured to oscillate at a natural or fundamental frequency.

Embodiments described herein provide for decreasing the amount of time and energy required to start MEMS oscillating at a resonant frequency of the MEMS oscillator. The systems and methods allow systems employing MEMS oscillators to turn off the MEMS oscillators when not needed, reducing power consumption, and further allow systems employing MEMS oscillators to quickly turn on MEMS oscillators in an "on demand" manner such that applications employing the MEMS oscillators aren't unnecessarily delayed by the MEMS oscillator startup process. The focusing of energy provided by these methods and systems further allows for a reduced amount of total energy to be supplied to start the MEMS oscillators oscillating. The systems and methods further allow for the adjustment of kick start signals to match the resonant frequency of various MEMS oscillators.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A MEMS resonator system comprising:
   a MEMS resonator having a movable member configured to oscillate at a natural resonant frequency;
   an oscillator configured to provide a series of pulses having a frequency near the natural resonant frequency of the MEMS resonator and a duration; and,
   kick start circuitry electronically coupled to the oscillator and the MEMS resonator, wherein the kick start circuitry is configured to receive the series of pulses from the oscillator, and provide the series of pulses to the MEMS resonator, wherein the frequency of the series of pulses is within 250 Hz of the natural frequency of the MEMS resonator.

2. A MEMS resonator system comprising:
   a MEMS resonator having a movable member configured to oscillate at a natural resonant frequency;
   an oscillator configured to provide a series of pulses having a frequency near the natural resonant frequency of the MEMS resonator and a duration;
   kick start circuitry electronically coupled to the oscillator and the MEMS resonator, wherein the kick start circuitry is configured to receive the series of pulses from the oscillator, and provide the series of pulses to the MEMS resonator; and,
   inverter circuitry electronically coupled to the kick start circuitry and the MEMS resonator, wherein the inverter circuitry is configured to receive the series of pulses as an input and provide the complement of the series of pulses as an output to the MEMS resonator.

3. A MEMS resonator system comprising:
a MEMS resonator having a movable member configured to oscillate at a natural resonant frequency and having a MEMS output and first and second MEMS inputs;
feedback circuitry electronically coupled to the MEMS output and configured to alter the phase and amplify the magnitude of a signal provided at the MEMS output to provide an altered signal;
an oscillator configured to provide a series of pulses having a frequency near the natural resonant frequency of the MEMS resonator and a having a duration;
kick start circuitry electronically coupled to the oscillator, wherein the kick start circuitry is configured to receive the series of pulses from the oscillator, and provide the series of pulses as an output;
an inverter electronically coupled to the kick start circuitry and configured to receive the series of pulses as an input and provide the complement of the series of pulses as a complementary series of pulses;
a switch electronically coupled to the feedback circuitry, kick start circuitry, and inverter, wherein the switch is configured to switch between providing the series of pulses and complementary series of pulses or the altered signal as a switched output;
driver circuitry electronically coupled to the switch and the first and second MEMS inputs of the MEMS resonator, wherein the driver circuitry is configured to provide the series of pulses to the first MEMS input and the complementary series of pulses to the second MEMS input when the switch provides the series of pulses and complementary series of pulses to the driver circuitry.

4. The MEMS resonator system as claimed in claim 3, wherein the series of pulses has a fundamental frequency within 250 Hz of the natural frequency of the MEMS resonator.

5. A MEMS resonator system, as claimed in claim 3, wherein the kick start circuitry is configured to provide a pre-determined number of pulses in the series of pulses to the MEMS resonator.

6. A method of accelerating the startup time of MEMS resonators in a system comprising a MEMS resonator and kick start circuitry, comprising:
generating a stream of pulses having a fundamental frequency near the resonant frequency of the MEMS resonator;
electronically coupling the stream of pulses to the MEMS resonator to provide to the MEMS resonator a pre-determined number of pulses sufficient to cause the MEMS resonator to oscillate at the resonant frequency of the MEMS resonator;
decoupling the stream of pulses from the MEMS resonator; and,
further including the steps of inverting the stream of pulses to create a complement of the stream of pulses, and electronically coupling the complement of the stream of pulses to the MEMS resonator.

7. A method of accelerating the startup time of MEMS resonators in a system comprising a MEMS resonator and kick start circuitry, comprising:
generating a stream of pulses having a fundamental frequency near the resonant frequency of the MEMS resonator;
electronically coupling the stream of pulses to the MEMS resonator to provide to the MEMS resonator a pre-determined number of pulses sufficient to cause the MEMS resonator to oscillate at the resonant frequency of the MEMS resonator;
decoupling the stream of pulses from the MEMS resonator; and,
further including the step of electronically coupling feedback circuitry to the MEMS resonator subsequent to the decoupling of the stream of pulses, wherein the feedback circuitry is configured to alter at least one of a phase and amplitude of a signal provided at an output of the MEMS resonator, and provide the altered signal to the input of the MEMS resonator.

8. A MEMS resonator system as claimed in claim 2, wherein the kick start circuitry and feedback circuitry are electronically coupled to the MEMS resonator via a switch, and wherein the inverter circuitry is electronically coupled to the kick start circuitry and the MEMS resonator via the switch, and wherein the switch is further configured to select between providing the series of pulses and complementary pulses, and the altered signal, to the MEMS resonator.

* * * * *